(12) United States Patent
Dauth

(10) Patent No.: US 7,212,600 B1
(45) Date of Patent: May 1, 2007

(54) METHOD AND APPARATUS FOR AUTOMATICALLY PRODUCING CLOCK SIGNALS FOR SAMPLING DATA SIGNALS AT DIFFERENT DATA RATES VIA A PHASE LOCKED LOOP

(75) Inventor: Fritz-Joerg Dauth, Holzkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/936,670

(22) PCT Filed: Mar. 1, 2000

(86) PCT No.: PCT/DE00/00641

§ 371 (c)(1),
(2), (4) Date: Jan. 2, 2002

(87) PCT Pub. No.: WO00/56026

PCT Pub. Date: Sep. 21, 2000

(30) Foreign Application Priority Data

Mar. 15, 1999 (DE) ................................ 199 11 464

(51) Int. Cl.
*H03D 3/24* (2006.01)
(52) U.S. Cl. ....................................... 375/376
(58) Field of Classification Search ................ 375/354, 375/371–373, 375–376; 327/147, 156; 348/536–537; 713/600
See application file for complete search history.

(56) References Cited

U.S. PATENT DOCUMENTS

| 5,297,181 A | 3/1994 | Barr et al. |
| 5,367,545 A * | 11/1994 | Yamashita et al. .......... 375/372 |
| 5,541,933 A | 7/1996 | Basnuevo et al. |
| 5,572,515 A | 11/1996 | Williamson et al. |
| 5,917,552 A * | 6/1999 | Van Court ................... 348/558 |

FOREIGN PATENT DOCUMENTS

| DE | 197 04 299 A1 | 8/1998 |
| EP | 0 862 272 A2 | 9/1998 |
| WO | WO 97/37451 | 10/1997 |
| WO | WO 99/39483 | 8/1999 |

OTHER PUBLICATIONS

XP-002106977 Bit-rate-Independent SDH/SONET Regenerator for Optical Network, Ushirozawa et al, pp. 25-28.
XP-000885351, Dynamic Automatic Optical Baud Rate Selection, IBM Technical Disclosure Bulletin, vol. 36, No. 5, May 1993.
XP-002143895, ISSCC99/Session 20/Paper WA 20.2.

* cited by examiner

*Primary Examiner*—Young T. Tse
(74) *Attorney, Agent, or Firm*—Bell, Boyd & Lloyd LLP

(57) ABSTRACT

A method and system for automatically producing clock signals for sampling data signals at different data rates via a phase locked loop, wherein in a synchronization process by means of the phase locked loop, a data signal is sampled successively using a clock signal at different frequencies, which are associated with different transmission protocols, and is checked for the presence of protocol identification information associated with the selected clock signal, until protocol identification information is detected such that the frequency resolution of the phase locked loop is advantageously increased, and the synchronization of the clock signal to the data signal is improved.

14 Claims, 2 Drawing Sheets

FIG 2                                                                                                         tab

| Data set No. | Transmission protocol | Protocol identification information | Control device control information | Overhead control information |
|---|---|---|---|---|
| te1 | SDH (STM-1) (155 Mbit/s) | PID1 (e.g. A1 and A2 byte in the SOH of an SDH signal) | PLL_WORD1 | CNT_WD1 |
| te2 | SDH (STM-4) (622 Mbit/s) | PID2 (e.g. A1 and A2 byte in the SOH of an SDH signal) | PLL_WORD2 | CNT_WD2 |
| te3 | SDH (STM-16) (2.5 Gbit/s) | PID3 (e.g. A1 and A2 byte in the SOH of an SDH signal) | PLL_WORD3 | CNT_WD3 |
| te4 | Gigabit-Ethernet (1.25 Gbit/s) | PID4 (Idle; Preamble; SFD-"Start Frame Delimiter") | PLL_WORD4 | CNT_WD4 |
| te n | ............ | PIDn | PLL_WORDn | CNT_WDn |

METHOD AND APPARATUS FOR AUTOMATICALLY PRODUCING CLOCK SIGNALS FOR SAMPLING DATA SIGNALS AT DIFFERENT DATA RATES VIA A PHASE LOCKED LOOP

BACKGROUND OF THE INVENTION

The high level of transparency of optical networks with regard to data transmission rates and the use of different transmission methods and transmission protocols for the transmission of digital information (for example, the Synchronous Digital Hierarchy SDH, Gigabit-Ethernet, Fiber Channel) requires future devices for data regeneration and for reproduction of the amplitude, flank and clock of a transmitted digital data signal or data stream—also referred to as "3R data regeneration".

Apparatuses for producing a clock signal from a digital data stream or from a data signal stream are known. Phase/frequency control loops or phase locked loops are frequently used for clock recovery and include, for example, a phase discriminator, a frequency discriminator, a loop filter, voltage controlled oscillators (also referred to as VCOs) and variable digital frequency dividers. The function of phase locked loops for clock recovery from a digital data stream and for sampling of the digital data stream to be regenerated via a sampling flipflop are sufficiently well known to those skilled in the art, such that their method of operation will not be described in further detail.

Various methods for determining the data transmission rate of the digital data stream are used to preset the phase locked loop. All the methods used, in particular, in wide area networks or WAN communications networks are based on more or less exactly determining the statistically distributed flank changes in the data stream within a defined observation time period. Conclusions can be drawn on the actual data transmission rate from the number of flank changes identified. These methods are also referred to as flank density analyses. Apart from the described flank density analysis, period duration measurements of individual bits are also used for low transmission rates.

By way of example, Laid-Open Specification DE 197 04 299 A1 describes an apparatus for producing a clock signal from a data signal, and a bit rate identification device for determining the bit rate of the incoming data signal. The apparatus includes a phase/frequency control device and a frequency divider device which is arranged in the feedback part of the phase/frequency control device and can be switched via a data word. The switchable frequency divider device is connected to the bit rate identification device, to which the digital data stream and at least one reference frequency signal can be supplied. The bit rate identification device provides a bit-rate-dependent data word as a function of the applied reference frequency signal and the digital data stream passed to it. This is then supplied to the frequency divider device arranged in the phase/frequency control device. The described apparatus for producing a clock signal from a digital data signal or data stream has the disadvantage that the resolution of the identification circuit is highly limited; that is, digital data stream transmission rates which differ by less than a factor of 4 cannot be distinguished reliably in this way. A further disadvantage is the risk of false synchronization to side lines in the frequency spectrum during the transmission of certain data contents, for example, when transmitting AIS information in SDH signals (Synchronous Digital Hierarchy).

The present invention is, therefore, directed toward improving the production of a clock signal from a transmitted digital data signal during a synchronization process and, in particular, the synchronization of the clock signal to the incoming digital data signal.

SUMMARY OF THE INVENTION

The method according to the present invention provides for automatic production of clock signals for sampling data signals at different data rates via a phase locked loop. A major aspect of the method according to the present invention is that, during a synchronization process, the data signal is sampled successively using a clock signal at different frequencies, which are associated with different transmission protocols, and is checked for the presence of protocol identification information associated with the selected clock signal, until protocol identification information is detected.

A major advantage of the method according to the present invention is that the link between the detection of the transmission rate of the transmitted digital data signal and the detection of the transmission protocol that is matched to the frequency of the digital data signal or of the clock signal that is produced avoids false synchronization of the clock signal that is produced to side lines, harmonics and subharmonics of the transmission frequency or transmission rate of the data signal. The method according to the present invention also makes it possible to distinguish reliably between transmission rates that are arranged adjacent in the frequency domain, for example, distinguishing between "Gigabit-Ethernet" at a transmission rate of 1.25 Gbit/s and "Fiber Channel" at a transmission rate of 1.064 Gbit/s. A further advantage of the method according to the present invention is that it allows the transmission rate to be set automatically to "3R data regeneration" for frame-oriented transmission methods, and automatic identification of the respective transmission protocol. In future optical communication networks, the method according to the present invention will allow not only pure wavelength conversion via flexible "3R data regeneration", but also analysis of the respectively transmitted digital data signals or data streams, for example, for the preprocessing of statistics, in order to provide network planning, or for volume-dependent billing.

Additional features and advantages of the present invention are described in, and will be apparent from, the following Detailed Description of the Invention and the Figures.

BRIEF DESCRIPTION OF THE FIGURES

FIG. 2 shows an example of a tabular representation of the binary information which is required to carry out the method according to the present invention and is stored in a memory in the circuit arrangement.

DETAILED DESCRIPTION OF THE INVENTION

Figure 1:
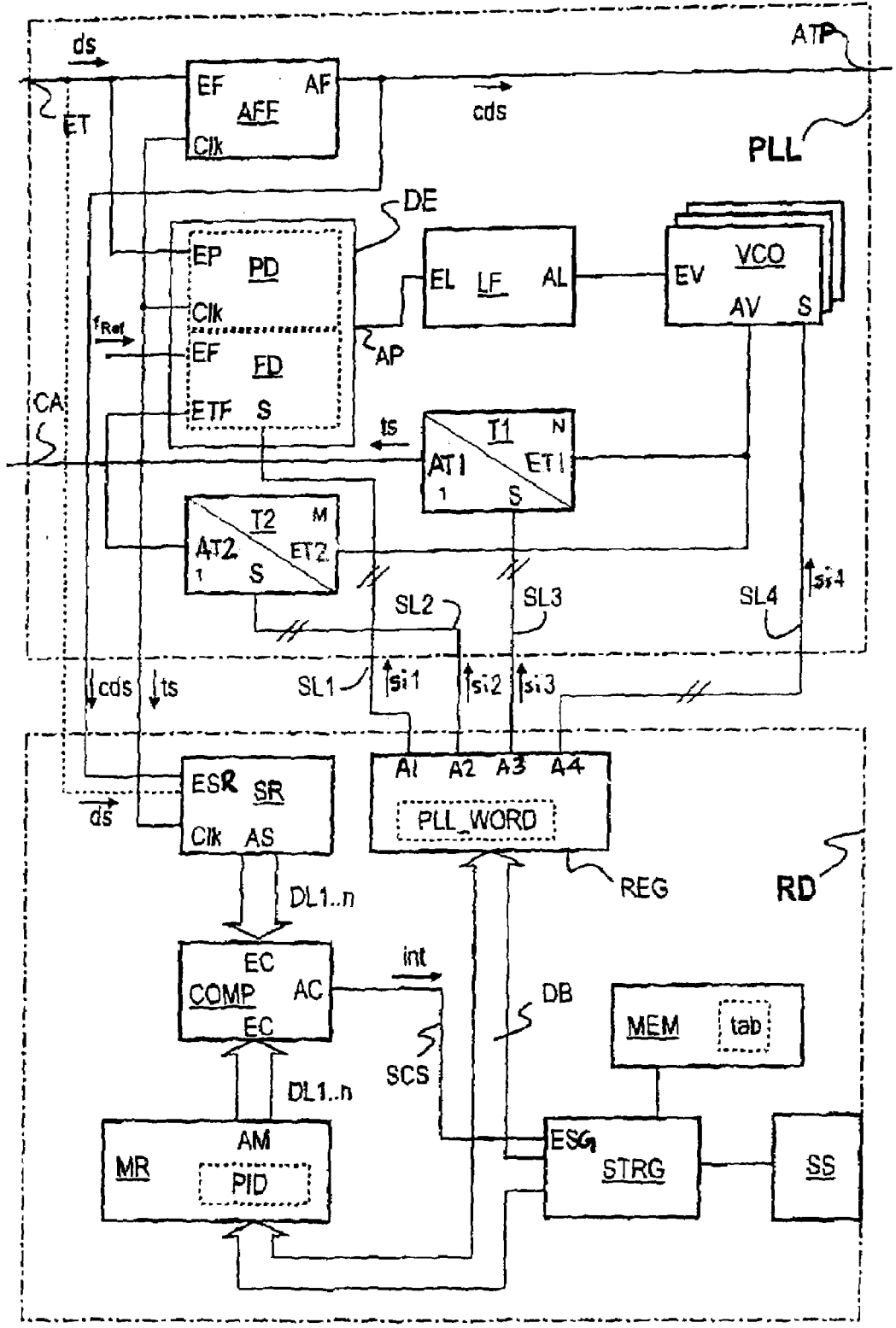
FIG. 1 shows a circuit arrangement for producing a clock signal, according to the present invention, from a transmitted digital data stream.

FIG. 1 uses a block diagram to show an exemplary embodiment of a circuit arrangement for producing a clock signal ts from a digital data signal or data stream ds passed to it. The circuit arrangement illustrated in FIG. 1 is subdivided into two functional circuit units PLL, RD, which are each represented by a rectangle with a dashed-dotted outline. The first functional circuit unit includes a phase/frequency control device (PLL), which is generally known to those skilled in the art and is also referred to as a phase locked loop or PLL circuit. The second circuit unit includes a frame identification RD, which is connected to the phase/frequency control device (PLL) and is also referred to in the following text as frame detector.

A digital data stream ds transmitted with the aid of a transmission protocol is passed to one input ET of the phase/frequency control device PLL and is passed on to an input EF1 of a sampling flipflop AFF. In the exemplary embodiment, it is assumed that the data stream ds is transmitted in accordance with the Synchronous Digital Hierarchy SDH. The Synchronous Digital Hierarchy is based on synchronous transmission of user information using synchronous transport modules (also referred to as STM) with a standard structure. The basic transport module is the STM-1 frame, with a data transmission rate of 155 Mbit/s. Each STM-1 frame includes a matrix of 9 rows each having 270 data octets. The frame has a repetition frequency of 125 μs, and the transmission is carried out at a bit rate of 155.520 Mbit/s. The STM-1 frame is inserted into a payload and an overhead, with the first 9 octets in all 9 rows containing the overhead, and the remaining columns containing the payload. The overhead contains information which is required to operate SDH systems, and these are also referred to as section overheads (SOH) and are transported in the SOH areas of the overhead. The SOH areas contain, for example, the A1 and A2 bytes, which are known to those skilled in the art, and which each represent frame identification information.

The data input ET of the phase/frequency control device PLL is at the same time connected to a first input EP of a discriminator unit DE. A reference signal $f_{Ref}$ at a reference frequency is passed to a second input EF2 of the discriminator unit DE. The discriminator unit DE is functionally subdivided into two components, a phase discriminator PD and a frequency window discriminator FD, each indicated by a rectangle with a dashed outline.

The discriminator unit DE is connected via an output AP to an input EL of a loop filter LF, which is, in turn, connected via an output AL to an input EV of a voltage controlled oscillator VCO. A first and a second variable digital frequency divider T1,T2 is each connected via an input (ET1, ET2) to an output AV of the voltage controlled oscillator VCO. The first digital frequency divider T1 is connected to a clock input CLK of the phase discriminator PD, and the second digital frequency divider T2 is connected to a divider input ETF of the frequency window discriminator FD, in each case via an output AT2. The described discriminator unit DE, including a phase window discriminator PD and a frequency window discriminator FD, as well as the loop filter LF, the voltage controlled oscillator VCO and the two variable digital frequency dividers T1, T2 are functional components of a generally known phase locked loop, whose function for recovery of the clock from the data stream ds passed to it in addition to the sampling of the data stream ds to be regenerated in conjunction with the sampling flipflop AFF are sufficiently well known to those skilled in the art, and will not be described in any more detail in the following text.

The phase/frequency control device PLL has a clock output CA which is connected to the output AT1 of the first frequency divider T1, and to which the clock signal ts which is produced is passed. The output AT1 of the first frequency divider T1 is, in turn, connected to a clock input CLK of the sampling flipflop AFF. The sampling flipflop AFF is connected via an output AF to a data output ATP of the phase/frequency control device PLL, to which the data stream cds, regenerated via the sampling flipflop AFF, is passed. Furthermore, the output AF of the sampling flipflop AFF is connected to an input ESR of a shift register SR arranged in the frame identification unit RD. The shift register SR has a clock input CLK which is connected to the output AT1 of the first frequency divider T1.

Furthermore, a memory MEM is arranged in the frame identification unit RD and is connected via a connecting line to a control unit STRG arranged in the frame identification unit RD. A table tab, illustrated in FIG. 2, is stored in the memory MEM. The illustrated table tab has a number of table entries te1 . . . n, with each table entry te1 . . . n having a respectively associated, defined transmission protocol. Each table entry te1 . . . n is used to store protocol identification information PID1 . . . n which uniquely identifies the respectively defined transmission protocol (for example, the frame identification information contained in the overhead information, in this case the A1 and A2 bytes) control loop control information PLL_WORD1 . . . n for setting the phase/frequency control device PLL to the transmission rate to be expected for the data stream ds, and further overhead control information CNT_WD1 . . . n for optional protocol-specific evaluation and processing of the overhead information arranged in the respective data packets or data frames of the data stream ds, cds. The overhead control information CNT_WD1 . . . n can be used to evaluate, and if necessary to recalculate, for example, the B1 byte contained in the overhead information in a data stream transmitter using the SDH transmission method.

The control unit STRG is connected via a data bus DB having a number of data lines to a memory register MR, which is arranged in the frame identification unit RD and to which protocol identification information PID1 . . . n which is stored in the memory MEM can be transmitted and stored therein, indicated by a rectangle with a dashed outline. The shift register SR and the memory register MR are connected via respective outputs AS, AM and a respective number of data lines DL1 . . . n to corresponding inputs EC of a comparator unit COMP. The comparator COMP has comparison capabilities which are used to compare the binary information or data words applied to the inputs EC, and the comparison result is transmitted in the form of a data signal int via an output AC and a signaling line SCS to an input ESG of the control unit STRG.

The data bus DB is also used to connect the control unit STRG to a register unit REG, which is connected via first outputs A1 and via first control lines SL1 to a control input S of the frequency window discriminator FD, via second outputs A2 and via second control lines SL2 to corresponding control inputs S of the second controllable frequency divider T2, via third outputs A3 and third control lines SL3 to corresponding inputs S of the first controllable frequency divider T1, and via fourth outputs A4 and fourth control lines SL4 to corresponding inputs S of the voltage controlled oscillator VCO. The register unit REG has one or more memory registers (FIG. 1 shows only one memory register, in the form of a rectangle with a dashed outline) in each of which the control device control information PLL_WORD1 . . . n stored in the memory MEM, or control words or binary information derived from such control information, can be stored, via which the circuitry components, in this case FD, PD, LF, VCO, T1 and T2, arranged in the phase/frequency control device PLL can be controlled. Alternatively, analog signals can be derived from the control words stored in the register REG, and can be supplied to the circuitry components.

The frame identification unit RD also has a control/monitoring interface SS, which is connected to the control unit STRG via a connecting line.

The method, which can be implemented via the circuit arrangement illustrated in FIG. 1, for producing a clock signal ts from the digital data stream ds transmitted with the aid of a transmission protocol optionally allows both the manual and automatic selection of a transmission protocol, and corresponding presetting of a data transmission rate matched to the selected transmission protocol. The method for producing the clock signal ts on the basis of manual selection, also referred to as a manual operating mode, and on the basis of automatic selection, also referred to as an automatic operating mode—of the transmission protocol and of the associated data transmission rate is explained in more detail in the following text with reference to the circuit arrangement illustrated in FIG. 1. For the further exemplary embodiment, it is assumed that the digital data stream ds is transmitted with the aid of a frame-oriented transmission protocol, in this case STM-1, to the input ET of the phase/frequency control device (PLL) and is passed on to the data input EF of the sampling flipflop AFF.

Manual Operating Mode

During manual operation of the circuit arrangement, the transmission protocol with which the digital data stream ds is transmitted to the data input EF of the sampling flipflop AFF is known. On the basis of the knowledge of the transmission protocol, the control unit STRG arranged in the frame identification unit RD selects the first table entry te1 that is associated with the STM-1 transmission protocol in the table tab and reads the corresponding control loop control information, in this case PLL_WORD1, from the memory MEM, and transmits this via the data bus DB to the corresponding register or registers in the register unit REG. Alternatively, further control information can be derived from the transmitted control loop control information PLL_WORD, and can be stored in the corresponding register in the register unit REG. According to a further embodiment (not illustrated) a number of control words or control device control information items associated with the STM-1 transmission protocol also can be stored in the respective table entries te1 . . . n in the table tab (not illustrated in FIG. 2), which are transmitted via the data bus DB to corresponding registers in the register unit REG. The transmission of the control loop control information PLL_WORD1 . . . n stored in the memory MEM allows the circuitry components VCO, T1, T2, FD, PD, LF to be preset to the corresponding data transmission rate of the incoming digital data stream ds, in this case 155 Mbit/s. Furthermore, the control unit STRG reads the protocol identification information, in this case PID1, associated with the selected transmission protocol, in this case STM-1, from the corresponding table entry te1 in the table tab, and transmits this via the data bus DB to the memory register MR, in which it is temporarily stored. In this exemplary embodiment, the frame identification word which is specific for the STM-1 transmission protocol and includes the last A1 and the first A2 byte of the overhead information is transmitted as the protocol identification information PID1 to the memory register REG.

As already explained, the phase locked loop which is arranged in the phase/frequency control device PLL is matched to the data transmission rate of the incoming digital data stream ds via the control loop control information PLL_WORD1 stored in the register unit REG. By way of example, the transmission of appropriate control information si2, si3 via the control lines SL2 and SL3 sets the controllable frequency dividers T1, T2 such that the frequency of the signal delivered from the voltage controlled oscillator VCO is divided as appropriate for matching of the optimum operating point of the phase discriminator PD and of the frequency window discriminator FD. Additional control information, in this case si4, transmitted via the fourth control line SL4 is used to provide any possibly required presetting or switching of the voltage controlled oscillator VCO. According to one alternative embodiment of the circuit arrangement, a number of voltage controlled oscillators VCO can be arranged in the phase/frequency control device PLL, in which case one voltage controlled oscillator VCO, which is matched to the data transmission rate of the incoming digital data stream ds, in each can case be selected with the aid of the fourth control signal si4.

According to a further embodiment of the circuit arrangement, which is not illustrated in FIG. 1, the loop filter LF arranged in the phase/frequency control device PLL is likewise controlled as a function of the control loop control information PLL_WORD1 . . . n stored in the register unit REG.

The digital data stream cds sampled with the aid of the recovered clock signal ts is read to the shift register SR, that is to say the shift register SR contains the data bits read with the aid of the recovered clock ts. Alternatively, the data stream ds which is applied to the input ET but is not sampled also can be read to the shift register SR, which is clocked by the clock signal ts, via a connecting line, indicated by a dashed connecting line in FIG. 1.

The bit sequence read to the shift register SR is permanently compared by the comparator unit COMP with the protocol identification information, in this case pid1, temporarily stored in the memory register MR. If the comparator unit COMP finds a match or a partial match between the digital bit sequence that is read and the protocol identification information pid1, a corresponding control signal int is generated in the comparator unit COMP, and is transmitted via the control line SCS to the control unit STRG. The transmission of the control information int to the control unit STRG indicates the identification of the selected transmission protocol, in this case STM1, and the setting of the associated data transmission rate for the phase/frequency control device PLL.

In order to improve the synchronization of the clock signal ts that is produced to the incoming digital data stream ds, according to a further embodiment that is not illustrated, the control unit STRG checks whether the protocol identification information, in this case pid1, is identified more than once, for example three times, in a cycle time which is specific for the selected transmission protocol. If the transmission protocol being used resulting the frame sequence being asynchronous, for example when using the Gigabit-Ethernet transmission protocol, this embodiment allows the pause pattern, or "Interframe Gap", to be analyzed.

When the selected or expected protocol identification information pid1 is identified in the sampled data stream cds, the start of data transmission can be recorded via the control unit STRG. If there are no periodically produced data frames, for example when using the STM-1 transmission protocol, it is advantageously possible in conjunction with further parameters, for example loss of the signal (LOS) or optical level, to deduce that there is a fault or that this is the end of transmission. In the situation where the phase locked loop which is arranged in the phase/frequency control device PLL becomes synchronized to an adjacent transmission rate, for example PDH at 140 Mbit/s, the analysis of the incoming data frames according to the present invention makes it possible to identify and record the fact that the preselected transmission protocol is not being used and/or has not been identified. If, for example, the preselected transmission protocol is not identified, termination of the connection can be initiated automatically.

Automatic Operation

When using the circuit arrangement illustrated in FIG. 1 in the automatic operating mode, the clock signal ts which is produced by the phase/frequency control device PLL should be synchronized without any operator action to the digital data stream arriving at the data input ET, allowing subsequent "3D data regeneration" of the digital data stream ds. For this purpose, all the transmission protocols to be expected are stored in the table tab arranged in the memory MEM, together with the associated protocol-specific protocol identification information pid1 . . . n and the associated control device control information PLL_WORD1 . . . n for setting the phase/frequency control device PLL to the data transmission rate to be expected. When the automatic operating mode is activated, this causes the control unit STRG to transmit the protocol identification information PID1 . . . n and control device control information PLL_WORD1 . . . n arranged in the table tab of the memory MEM step-by-step in the described manner and cyclically to the register unit REG and, respectively, to the memory register MR, until the comparator unit COMP identifies a defined transmission protocol stored in the table tab, and signals this to the control unit STRG. When a transmission protocol stored in the memory MEM is identified, the cyclic processing of the table tab arranged in the memory MEM is ended. If the currently selected transmission protocol is not identified, the described, successive run through the stored protocol identification information PID1 . . . n and control device control information PLL_WORD1 . . . n is carried out once again, after a predefined, protocol-specific delay.

The automatic protocol search sequence can be enabled only by an operator action. According to a further advantageous embodiment, selective enabling can be carried out by selection of the transmission protocols stored in the table tab via an appropriate identifier in the respective table entries te1 . . . n.

In order to further improve the synchronization monitoring, the current state of the phase/frequency control device PLL can be detected with the aid of a generally known lock detector (not illustrated) which is also arranged in the phase/frequency control device PLL, and can be signaled to the control unit STRG.

The control/monitoring interface SS which is connected to the control unit STRG allows the table entries te1 . . . n which are stored in the memory MEM to be processed and updated and, in addition to the monitoring of the respectively transmitted transmission protocols, allows the enabling of specific transmission protocols to be controlled. The control/monitoring interface SS also makes it possible to switch between the described manual or automatic operating modes. The control/monitoring interface SS can, for example, be connected to a higher-level network administration unit or network management unit so that, for example, it is possible for a network operator to monitor and to control the data transmission rate of the digital data stream ds arriving at the phase/frequency control device PLL.

The linking, according to the present invention, of the presetting of the data transmission rate to be expected to the phase/frequency control device PLL (which is generally known to those skilled in the art) and the checking of the transmission protocol used for transmitting the digital data stream by partial evaluation of the overhead information contained in the individual data frames avoids false synchronization of the clock signal to side lines, harmonics and subharmonics of the data transmission rate. The method according to the present invention also makes it possible to distinguish reliably between data transmission rates which are separated only slightly, by evaluation of the various overhead information items.

Although the present invention has been described with reference to specific embodiments, those of skill in the art will recognize that changes may be made thereto without departing from the spirit and scope of the invention as set forth in the hereafter appended claims.

The invention claimed is:

1. A method for automatically producing clock signals for sampling data signals, which are transmitted with the aid of transmission protocols, at different data rates via a phase locked loop, the data signals having at least one binary protocol identification information item that uniquely identifies a transmission protocol, the method comprising the steps of:

sampling, during a synchronization process, a data signal successively using varied clock signals, selected by a control unit of a protocol detector, at different frequencies which are associated with different transmission protocols;

storing at least a portion of the data signal and detecting the sampled data signal by the protocol detector; and checking the data signal, during the synchronization process, for the presence of protocol identification information associated with a selected clock signal until the protocol identification information is identified for the transmission protocol.

2. A method for automatically producing clock signals for sampling data signals at different data rates via the phase locked loop as claimed in claim 1, wherein the identified protocol identification information is included as overhead information of a data frame.

3. A method for automatically producing clock signals for sampling data signals at different data rates via the phase locked loop as claimed in claim 2, the method further comprising the step of:

processing, once the protocol identification information has been identified, at least some of respective overhead information.

4. A method for automatically producing clock signals for sampling data signals at different data rates via the phase locked loop as claimed in claim 1, wherein the identified protocol identification information represents a pause signal.

5. A method for automatically producing clock signals for sampling data signals as claimed in claim 1, wherein the transmission protocol is selected from the group consisting of Synchronous Transport modules 1, 4 and 16 (STM-1, STM-4, STM-16), fiber channel and Gigabit-Ethernet protocols.

6. An apparatus for automatically producing clock signals for sampling data signals, which are transmitted with the aid of transmission protocols, at different data rates, the data signals having at least one binary protocol identification information item which uniquely identifies a transmission protocol, the apparatus comprising:

a phase locked loop for synchronization of a clock signal to a data signal passed to a phase/frequency control device;

at least one controllable frequency divider device arranged in a feedback path of the phase/frequency control device;

a control unit for selecting and varying the clock signal to frequencies corresponding to different respective transmission protocols;

a sampling device for sampling, during a synchronization process, the data signal successively using the clock signal at different frequencies which are associated with different transmission protocols, using varied clock signals set by the control unit; and a protocol detector in which the control unit is arranged, the protocol detector storing at least a portion of the sampled data signal and checking the sampled data signal during the synchronization process for the presence of protocol identification information associated with a selected clock signal until the protocol identification information of the transmission protocol is identified.

7. An apparatus for automatically producing clock signals for sampling data signals as claimed in claim 6, further comprising:

a memory connected to the control unit, the memory being arranged in the protocol detector for storing the at least one binary protocol identification information item and at least one control device control information item associated with the respective binary protocol identification information item, which controls the phase locked loop on a protocol-specific basis, wherein the control unit forms at least one control signal from the at least one control device control information item, with the at least one control signal being transmitted to the phase locked loop, wherein the protocol detector produces a control signal representing an identification result which is transmitted to the control unit, and wherein the control unit is designed such that at least one control signal, representing a frequency divider control information item, is formed from the at least one stored control device control information item and is transmitted to the at least one controllable frequency divider device.

8. An apparatus for automatically producing clock signals for sampling data signals as claimed in claim 7, wherein the control unit is designed such that, if a plurality of protocol identification information items are stored in the memory, control device control information items associated with the plurality of protocol identification information items are transmitted successively to the phase locked loop, and the respectively associated binary protocol identification information items are detected successively, with the control device control information items being transmitted successively as a function of the identification result.

9. An apparatus for automatically producing clock signals for sampling data signals as claimed in claim 7, wherein the protocol detector comprises:

a shift register to which the data signal or the sampled data signal, and the clock signal are passed;

a comparator connected to both the shift register and the control unit; and a memory register connected to both the comparator and the control unit for temporary storage of the protocol identification information;

wherein the comparator is designed such that the protocol identification information stored in the memory register is compared with the data signal or the sampled data signal read to the shift register and a comparison result is transmitted to the control unit with the aid of the control signal.

10. An apparatus for automatically producing clock signals for sampling data signals as claimed in claim 7, wherein different protocol identification information items and overhead control information items associated therewith are stored in the memory, the sampled data signal is supplied to the control unit for processing protocol-specific overhead information included in the data signal, and the overhead processing unit and the control unit are designed such that the overhead information is processed as a function of at least one overhead control information item associated with the identified transmission protocol.

11. An apparatus for automatically producing clock signals for sampling data signals as claimed in claim 7, further comprising:

a control/monitoring interface to which the control unit is connected, via which information stored in the memory can be updated and detection results can be transmitted to a higher-level communications unit.

12. An apparatus for automatically producing clock signals for sampling data signals as claimed in claim 7, wherein a number of voltage controlled oscillators provided in the phase-locked loop can be selected as a function of the at least one control device control information item.

13. An apparatus for automatically producing clock signals for sampling data signals as claimed in claim 7, further comprising:

a frequency window discriminator provided in the phase locked loop which defines a frequency of the clock signal as a function of the at least one control device control information item and is set by the control unit.

14. An apparatus for automatically producing clock signals for sampling data signals as claimed in claim 6, further comprising:

a loop filter provided in the phase locked loop.

* * * * *